United States Patent
Yun et al.

(10) Patent No.: US 11,734,489 B2
(45) Date of Patent: Aug. 22, 2023

(54) CIRCUIT LAYOUT VERIFICATION

(71) Applicant: Synopsys, Inc., Mountain View, CA (US)

(72) Inventors: Jinsik Yun, Cary, NC (US); Mark Daniel Pogers, Wake Forest, NC (US); Jonathan Calvin White, Mebane, NC (US); Chiu-Yu Ku, Taipei (TW); Danny Chang, Taipei (TW); Lihhsing Ke, Taipei (TW)

(73) Assignee: Synopsys, Inc., Sunnyvale, CA (US)

( * ) Notice: Subject to any disclaimer, the term of this patent is extended or adjusted under 35 U.S.C. 154(b) by 142 days.

(21) Appl. No.: 17/336,616

(22) Filed: Jun. 2, 2021

(65) Prior Publication Data

US 2021/0374322 A1    Dec. 2, 2021

Related U.S. Application Data

(60) Provisional application No. 63/033,573, filed on Jun. 2, 2020.

(51) Int. Cl.
*G06F 30/398* (2020.01)

(52) U.S. Cl.
CPC .................. *G06F 30/398* (2020.01)

(58) Field of Classification Search
CPC ..................................... G06F 30/398
USPC ....................................... 716/112
See application file for complete search history.

(56) References Cited

U.S. PATENT DOCUMENTS

| | | | |
|---|---|---|---|
| 2009/0101940 A1* | 4/2009 | Barrows | H03K 19/1778 716/128 |
| 2013/0298101 A1* | 11/2013 | Chandra | G06F 30/23 716/136 |
| 2014/0152337 A1* | 6/2014 | Ding | G01R 31/2644 438/11 |
| 2014/0282344 A1* | 9/2014 | Hsu | G06F 30/392 716/123 |

* cited by examiner

*Primary Examiner* — Suchin Parihar
(74) *Attorney, Agent, or Firm* — Lowenstein Sandler LLP

(57) ABSTRACT

A system, method, and computer readable medium with instructions for verifying an original layout are disclosed. The original layout includes cells arranged in a cell hierarchy, front-end-of-line (FEOL) layers, and back-end-of-line (BEOL) layers. In one embodiment, a reduced layout is generated by trimming out cells below a top tier of the cell hierarchy and filtering out the FEOL layers. A text-based short check is executed on the reduced layout. Next, an augmented reduced layout is generated. The augmented reduced layout includes pin information for cells in a second tier connected to the top tier. An interconnectivity check is then executed on the augmented reduced layout based on a schematic for the circuit. Afterwards, a result (e.g., location of short or connectivity mismatch) based on at least one of the text-based short check and the interconnectivity check is outputted. A conventional LVS check may then be executed.

20 Claims, 13 Drawing Sheets

CIRCUIT LAYOUT VERIFICATION

CROSS-REFERENCE TO RELATED APPLICATIONS

This application is a non-provisional application claiming the benefit of U.S. Provisional Patent Application Ser. No. 63/033,573, which was filed on Jun. 2, 2020. Accordingly, this application claims priority under 35 U.S.C. § 119(e) to U.S. Provisional Patent Application Ser. No. 63/033,573, which is hereby incorporated by reference in its entirety.

TECHNICAL FIELD

The present disclosure relates to a system and method for circuit layout verification using short checks, interconnectivity checks, open checks, and layout-versus-schematic (LVS) checks.

BACKGROUND

Circuit schematics are becoming increasingly complex. For example, the number of circuit components are increasing and the number of connections are also increasing. In order to manufacture a circuit represented by a schematic, a layout of the circuit is generated. The layout represents the schematic in a form that a foundry can interpret and process/manufacture. Before sending the layout to the foundry, it is verified that the layout matches the schematic. With circuits becoming increasingly complex, existing verification processes such as LVS check are requiring longer runtimes and consuming more computing resources (e.g., CPU and memory).

SUMMARY

One or more embodiments are directed towards a method for verifying an original circuit layout. The original layout includes cells arranged in a cell hierarchy, front-end-of-line (FEOL) layers, and back-end-of-line (BEOL) layers. The method includes generating a reduced layout for the circuit by trimming a first subset of the cells below a top tier of the cell hierarchy and filtering out the FEOL layers. Next, a text-based short check is executed on the reduced layout for the circuit. The method also includes generating an augmented reduced layout for the circuit including pin information extracted from the original layout for a second subset of the cells connected to the top tier. Then, an interconnectivity check is executed on the augmented reduced layout based on a schematic for the circuit. Further, a result based on at least one of the text-based short check and the interconnectivity check is output.

One or more embodiments are directed towards a non-transitory computer readable medium storing instructions for verifying an original circuit layout. The original layout includes cells arranged in a cell hierarchy, front-end-of-line (FEOL) layers, and back-end-of-line (BEOL) layers. When executed by a processor, the instructions cause the processor to generate a reduced layout for the circuit by trimming a first subset of the cells below a top tier of the cell hierarchy and filtering out the FEOL layers. Then, the instructions cause the processor to execute a text-based short check on the reduced layout for the circuit. Next, the instructions cause the processor to generate an augmented reduced layout for the circuit including pin information extracted from the original layout for a second subset of the cells connected to the top tier. An interconnectivity check is executed on the augmented reduced layout based on a schematic for the circuit. Further, the instructions cause the processor to output a result based on at least one of the text-based short check and the interconnectivity check.

One or more embodiments are directed towards a system for verifying an original circuit layout. The original circuit layout includes cells arranged in a cell hierarchy, front-end-of-line (FEOL) layers, and back-end-of-line (BEOL) layers. The system includes a memory storing instructions and a processor coupled to the memory. When executed by the processor, the instructions cause the processor to generate a reduced layout for the circuit by trimming a first subset of the cells below a top tier of the cell hierarchy and filtering out the FEOL layers. Then, the instructions cause the processor to execute a text-based short check on the reduced layout for the circuit. Next, the instructions cause the processor to generate an augmented reduced layout for the circuit including pin information extracted from the original layout for a second subset of the cells connected to the top tier. An interconnectivity check is executed on the augmented reduced layout based on a schematic for the circuit. Further, the instructions cause the processor to output a result based on at least one of the text-based short check and the interconnectivity check.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

In the drawings, like reference numbers generally indicate identical or similar elements. Additionally, generally, the left-most digit(s) of a reference number identifies the drawing in which the reference number first appears.

DETAILED DESCRIPTION

Aspects of the present disclosure relate to circuit layout verification and accelerating LVS checks.

For a large circuit design, with current foundry technologies, it is common for a conventional LVS check to run for several tens of hours if not several days. And depending on the cleanness of the circuit design, it is also common to involve several iterations of debugging errors, fixing the circuit design, and then rerunning LVS. Overall, these iterations are time-consuming and difficult to manage due to the sheer complexity of the circuit. This difficulty of running LVS and debugging and iterating is often the root cause of unwanted schedule slip of the circuit design finishing.

This iteration is generally worse when LVS runs over the layout that merged all the design components for the first time because there are many possible new issues that can only be found after merging design components. Examples of these issues include integration errors at the top hierarchy design, interface pin alignment errors, design components developed with not-compatible technology, etc. The fix for these errors is not necessarily difficult once the LVS check as finished running, but these errors are making the LVS check runtime longer and machine requirements higher preventing designers from swiftly iterating debugging/fixing/rerunning the circuit design.

One or more embodiments provide a system, method, and non-transitory computer readable medium with instructions to reduce the LVS check runtime and the number of iterations required for a large circuit design. One or more embodiments may include: recognizing and filtering out the layers for creating primitive devices components (Front-End-Of-Line or FEOL layers); (2) trimming lower hierarchical design components; and (3) gradually adding up more components into LVS using separate stages. Moreover, one or more embodiments have the additional benefit of shortening the whole design cycle.

Figure 1A:
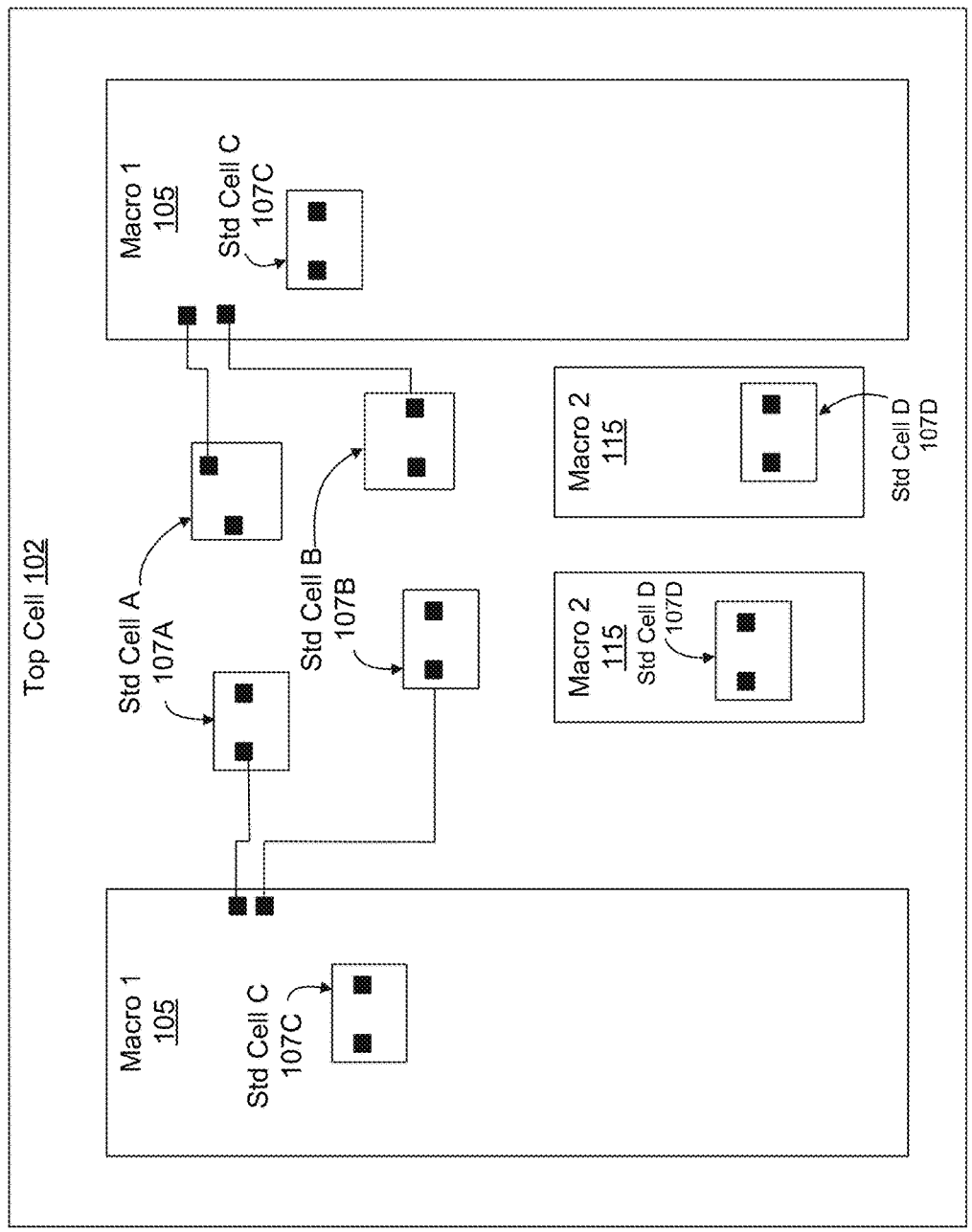
FIG. 1A depicts an example circuit layout in accordance with one or more embodiments.

FIG. 1A depicts an example of a circuit layout 100 in accordance with one or more embodiments. The circuit layout 100 is composed of multiple cells arranged in a cell hierarchy. Higher level cells may be built on lower level cells. For example, if a higher level cell is composed of inverters and NAND gates, previously designed inverter and NAND cells can be instantiated (e.g., added) to the higher level cell rather than recreating inverter and NAND gates in the higher level cell.

In FIG. 1A, top cell 102 may be a cell in the top tier of the cell hierarchy. As shown in FIG. 1A, top cell 102 contains multiple instances of macro 1 105, multiple instances of macro 2 115, multiple instances of standard cell A 107A, and multiple instances of standard cell B 107B. Macro 1 105, Macro 2 115, standard cell A 107A, standard cell B 107B are all cells in the second tier of the cell hierarchy and may directly connect to the top cell 102.

Still referring to FIG. 1A, macro 1 105 contains one or more instances of standard cell C 107C, while macro 2 115 contains one or more instances of standard cell D 107D. Standard cell C 107C and standard cell D 107D are cells in the third tier of the cell hierarchy and may directly connect to cells in the second tier (e.g., macro 1 105, macro 2 115). A circuit layout may have any number of cells and any number of tiers. Different cells may be owned/designed by different users/firms.

Figure 1B:
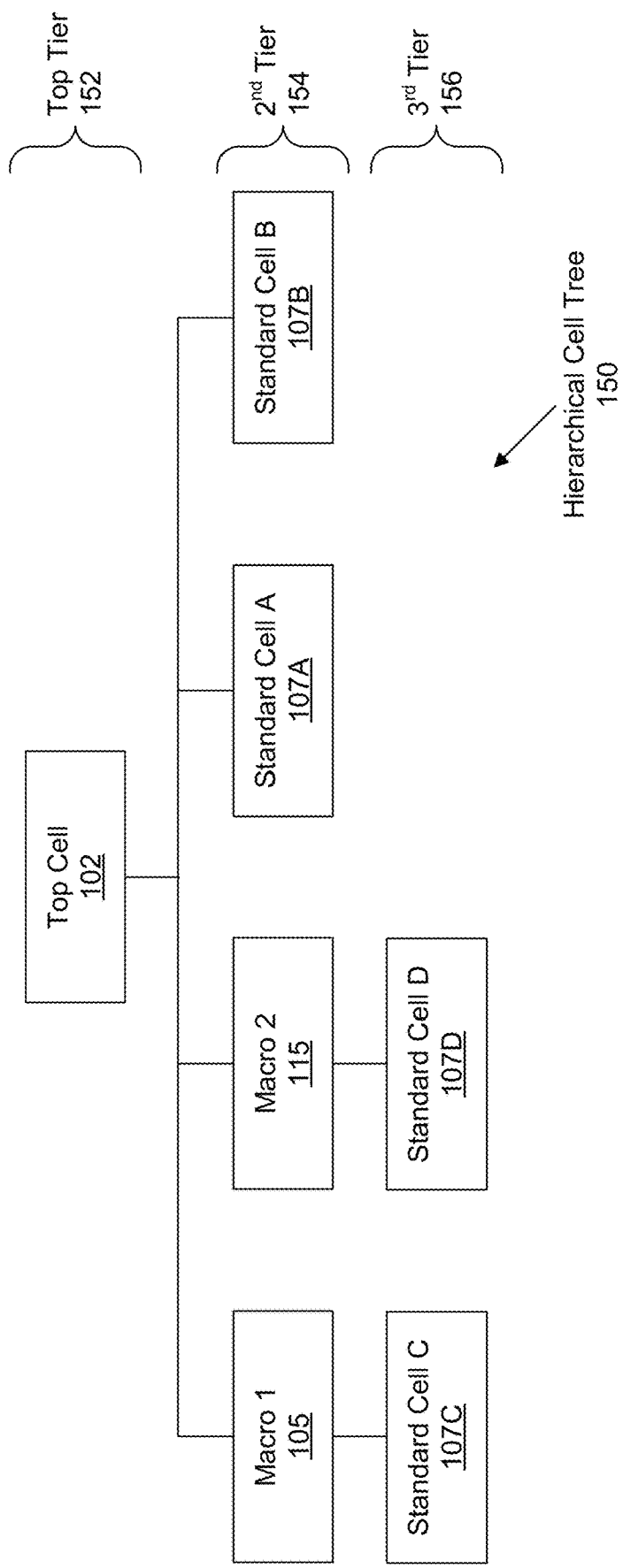
FIG. 1B depicts an example hierarchical cell tree in accordance with one or more embodiments.

FIG. 1B depicts an example hierarchical cell tree 150 in accordance with one or more embodiments. The hierarchical cell tree 150 is a visualization of the cell hierarchy of circuit layout 100 in FIG. 1A. As shown in FIG. 1B, there is a top tier 152, a second tier 154, and a third tier 156. As discussed above, macro 1 105, macro 2 115, standard cell A 107A, and standard cell B 107B are all cells in the second tier 154, which is below the top tier 152. As also discussed above, standard cell C 107C and standard cell D 107D are in the third tier 156, which is below the second tier 154. Although the top tier 152 is shown as only having top cell 102, in other embodiments, the top tier 152 may also include a place and route (PNR) cell, a fill cell, and a sealring cell (not shown), and the cells in the second tier 154 may connect directly to the PNR cell.

Figure 2:
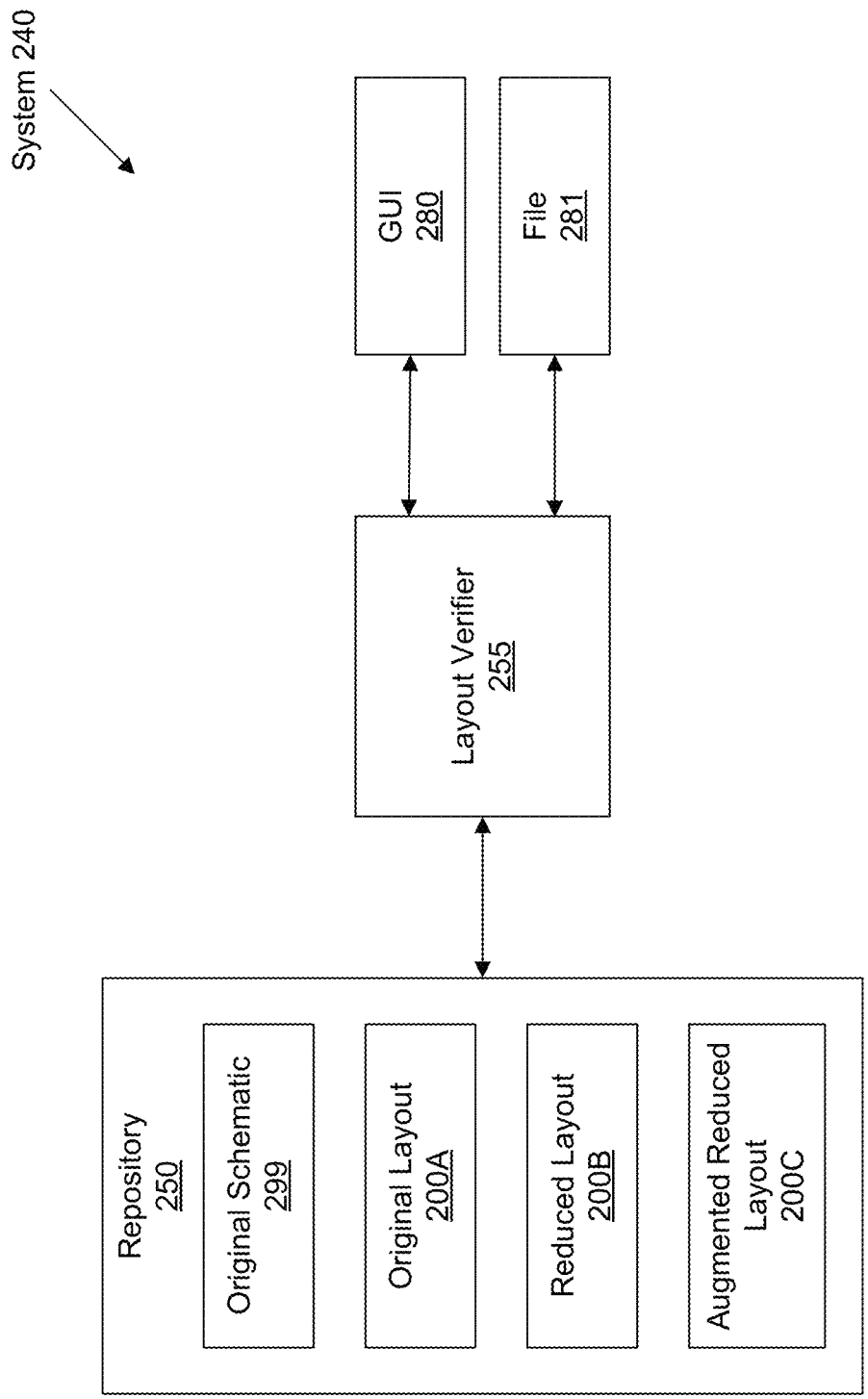
FIG. 2 depicts a system for circuit layout verification in accordance with one or more embodiments.

FIG. 2 shows a system 240 for circuit layout verification in accordance with one or more embodiments. As shown in FIG. 2, the system 240 includes a repository 250 and a layout verifier 255. Each of these components may be implemented in hardware, software, or any combination thereof. Moreover, different components (e.g., verifier 255, repository 250) may execute on the same or different computing devices (e.g., server, mainframe, desktop personal computer (PC), laptop, tablet PC, smartphone, etc.) connected by a network having wired and/or wireless segments.

In one or more embodiments, repository 250 stores an original schematic 299 and an original layout 200A for a circuit. In general, the original schematic 299 shows the components and interconnections of the circuit. In contrast, the original layout 200A is a representation of the circuit in terms of planar geometric shapes which correspond to the patterns of metal, oxide, or semiconductors layers that make up the components of the circuit (like circuit layout 100, discussed above in reference to FIG. 1).

In one or more embodiments, the layout verifier 255 is configured to generate reduced layout 200B and augmented reduced layout 200C, discussed below, from original layout 200A. Further, layout verifier 255 may be configured to execute checks (e.g., text-based short check, topological-based short check, interconnectivity check, open check, etc.) on reduced layout 200B and augmented reduced layout 200C, and then report the results of the checks (e.g., locations of shorts, connectivity mismatches, floating connections, etc.) in a GUI 280 and/or file 281. Further still, layout verifier 255 may be configured to correct (e.g., remove) the shorts, connectivity mismatches, floating connections, etc. by modifying one or more of the original layout 200A, the reduced layout 200B, and the augmented reduced layout 200C.

In one or more embodiments, layout verifier 255 is configured to execute a conventional LVS check on original schematic 299 and original layout 200A. However, layout verifier 255 may execute the conventional LVS check after the checks (e.g., text-based short check, topological-based short check, interconnectivity check, open check, etc.) on the reduced layout 200B and the augmented reduced layout 200C have been executed. If any shorts, connectivity mismatches, floating connections, etc. identified/detected during the checks are corrected in the original layout 200A before the conventional LVS check is executed, this will reduce the runtime of the conventional LVS check and reduce the computing resources consumed by the conventional LVS Although repository 250 is shown as separate from layout verifier 255, in other embodiments, repository 250 is internal to layout verifier 255. Moreover, layout verifier 255 may be an example of or a component of an Electronic Design Automation (EDA) verification tool.

Figure 3:
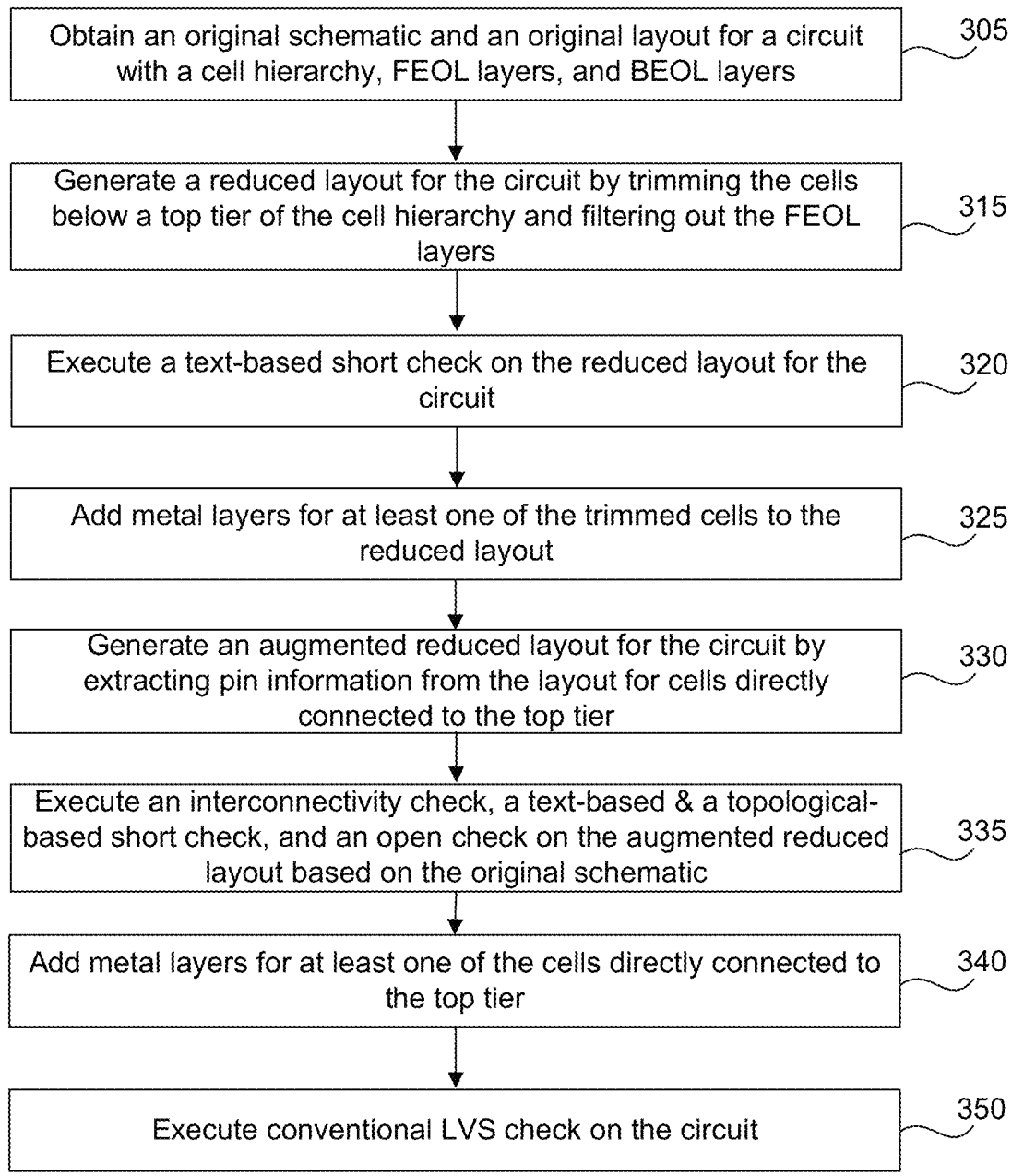
FIG. 3 depicts a flowchart for verifying a circuit layout in accordance with one or more embodiments.

FIG. 3 depicts a flowchart for verifying a circuit layout in accordance with one or more embodiments. One or more steps of the flowchart may be performed by the components of system 240 (e.g., layout verifier 255), discussed above in reference to FIG. 2. In one or more embodiments, one or more of the steps depicted in FIG. 3 may be omitted, repeated, and/or performed in a different order than the order depicted in FIG. 3. Accordingly, the scope of the present disclosure should not be considered limited to the specific arrangement of steps depicted in FIG. 3.

At 305, an original layout and an original schematic for the circuit is obtained. As discussed above, the circuit may be composed of cells arranged in a cell hierarchy. In other words, each cell may contain other cells. A single cell or a combination of cells may form a component of the circuit. In general, the original schematic shows the components and interconnections of the circuit. In contrast, the original layout for the circuit is a representation of the circuit, including the cells, in terms of planar geometric shapes which correspond to the patterns of metal, oxide, or semi-conductors layers that make up the components of the circuit. Those skilled in the art, having the benefit of this disclosure, will appreciate that each layer in the original layout may be classified as a front-end-of-line (FEOL) layer or a back-end-of-line (BEOL) layer. Moreover, BEOL layers generally correspond to metal layers and vias.

At 315, a reduced layout for the circuit is generated. Generating the reduced layout may include trimming (e.g., removing), from the original layout, the subset of cells that do not belong to the top tier of the cell hierarchy. Generating the reduced layout may also include filtering out the FEOL layers (e.g., Poly, Nwell, Diffusion, etc.) of the remaining cells. In one or more embodiments, following 315, only the BEOL layers of the cells in the top tier of the cell hierarchy remain.

In one or more embodiments, prior to execution of 315, the user may specify which cells belong to the top tier of the cell hierarchy and/or which cells do not belong to the top tier of the cell hierarchy. For example, this information may be specified in a file (e.g., ASCII file) that is read by the layout verifier 255. This data may be used to identify the cells in the top tier and trim (e.g., remove) the cells that do not belong to the top tier of the cell hierarchy.

Additionally or alternatively, the cells belonging to the top tier of the cell hierarchy may be determined automatically. In such embodiments, the layout verifier 255 may determine which cells belong to the top tier of the cell hierarchy by determining (e.g., measuring) each cell's properties (e.g., size of cell area, layer usage inside cell, etc.). For example, cells belonging to the top tier of the cell hierarchy tend to cover most of the entire circuit area. Accordingly, if the layout verifier 255 determines that a cell's area covers 80% of the entire circuit area, the cell likely belongs to the top tier. In contrast, a cell with an area that covers less than 30% of the entire circuit area is unlikely to be in the top tier.

As another example, certain layers are only used to build the structure of the top tier of the cell hierarchy. Accordingly, if the layout verifier 225 determines that a cell includes one or more of those layers, the cell likely belongs to the top tier. For example, if layers that are only used for a Sealring cell (which provides a physical boundary of cell area for a foundry process) or for a circuit packaging cell (which provides a physical connection from a chip to physical chip packaging outside of a chip) are included in a certain cell, the layout verifier 255 may determine that cell belongs to top tier as Sealring cell and circuit packaging cell are always at the top tier.

In one or more embodiments, prior to execution of 315, a request to include only a subset of the BEOL layers in the reduced layout may be received. This request may be issued by a software application (e.g., EDA verification tool) or by a user (e.g., LVS engineer). The request may specify the subset of BEOL layers (e.g., metal layers) individually or using a range. In response to the request, generating the reduced layout may also include filtering out the one or more BEOL layers (e.g., metal layers) that do not belong to the subset of BEOL layers specified in the request (e.g., BEOL layers outside the specified range).

At 320, a text-based short check is executed on the reduced layout. In one or more embodiments, as the reduced layout only has the cells from the top tier, and as the FEOL layers have been filtered out, the text-based short check may quickly (and without consuming excessive computing resources) identify/detect any shorts (e.g., conductors that are connected but should not be connected). The one or more results of the text-based short check may be the locations of the one or more shorts. These results may be output in the form of a GUI for display and/or a file to be read by another software application (e.g., EDA verification software).

In one or more embodiments, if a short is identified/detected, the short may be corrected (e.g., removed) in the reduced layout and/or the original layout (from 305).

At 325, the metal layers for one or more of the cells that were trimmed (in 315) may be added to the reduced layout. For example, the user (e.g., LVS engineer) or a software application (e.g., EDA verification tool) may specify one or more of the trimmed cells, and the metal layers of the one or more specified trimmed cells may then be added back to the reduced layout. Following the addition of these metal layers, the text-based short check may be performed again. Alternatively, the text-based short check might be skipped in 320 and only performed in 325. During this text-based short check, one or more shorts may be identified/detected in the newly added metal layers. Like 320, the one or more results of the text-based short check may be the locations of the one or more shorts. These results may be output in the form of a GUI for display and/or a file to be read by another software application (e.g., EDA verification software). If a short is identified/detected, the short may be corrected in the reduced layout and/or the original layout (from 305).

In one or more embodiments, step 325 is optional and may be triggered by the identification/detection of a short in 320. For example, a user may believe the identified/detected short (in 320) is associated with or caused by one or more of the trimmed cells. Accordingly, the user may then request that the metal layers of one or more of the trimmed cells be added to the reduced layout and the text-based short check be repeated. Alternatively, step 325 may be performed even when no short was identified/detected in step 320.

At 330, an augmented reduced layout for the circuit is generated. Like the reduced layout (in 315), the augmented reduced layout has the cells in the top tier of the cell hierarchy and the FEOL layers have been filtered out. In addition, the augmented reduced layout includes pin information for cells that are not in the top tier of the cell hierarchy but are directly connected to one or more cells in the top tier (e.g., pin information for cells in the second tier). The pin information may be extracted from the original layout (in 305) to generate the augmented reduced layout. Example pin information may include the locations of power and ground and/or signal pins within cells that are directly connected to one or more cells in the top tier and the layer(s) used for those power and ground and/or signal pins. Moreover, these second tier cells that are directly connected to cells in the top layer may be represented/treated as black boxes (with the extracted pin information) in the augmented reduced layout.

In one or more embodiments, the augmented reduced layout is generated from the original layout (in 305). In other words, the identification of the cells in the top tier, the trimming of cells in the lower tiers, and the filtering out of the FEOL layers are performed again before adding the second tier cells as black boxes with pin information. Additionally or alternatively, the augmented reduced layout may be generated by starting with the reduced layout (from 320) and adding the second tier cells black boxes with pin information. Starting with the reduced layout instead of the original layout may be beneficial if shorts were identified and corrected in the reduced layout.

At 335, one or more of an interconnectivity check, a text-based short check, a topological-based short check, and an open check may be executed on the augmented reduced layout. Those skilled in the art, having the benefit of this detailed description, will appreciate that one or more of these checks (e.g., interconnectivity check, topological-base short check) require comparisons with the schematic of the circuit (from 305). The one or more results of the checks may be the locations of the one or more shorts, floating connections, and/or connectivity mismatches.

In one or more embodiments of the invention, since only a subset of the cells are present in the augmented reduced layout, since the FEOL layers have been filtered out, and since the second tier cells are represented as black boxes with only pin information, these checks will quickly execute without consuming excessive computing resources.

In one or more embodiments, the interconnectivity check may include determining circuit connectivity in the schematic (from 305), determining circuit connectivity in the augmented reduced layout, and comparing the two circuit connectivities to confirm there is a match. The result(s) of the interconnectivity check including any identified connectivity mismatches between the top tier and the cells in the second tier may be output in the form of a GUI for display to a user. The GUI may display, for example, the location(s) of the connectivity mismatch(es). Additionally or alternatively, the result(s) of the interconnectivity check may be output to a file to be read by another software application (e.g., EDA verification software). One or more of the identified/detected connectivity mismatches may be corrected in the augmented reduced layout and/or the original layout (in 305).

In one or more embodiments, the text-based short check or topological-based short check may identify/detect shorts in the augmented reduced layout. The results of these short checks, including the locations of the identified/detected shorts, may also be displayed in a GUI. Additionally or alternatively, the results of the text-based short check or topological-based short check may be stored in a file to be read by another software application (e.g., EDA verification software). One or more of the identified/detected shorts may be corrected in the augmented reduced layout and/or the original layout (in 305).

In one or more embodiments, the open check may identify/detect floating connections (e.g., conductors that are not connected but should be connected). The results of this open check, including the locations of the identified/detected floating connections, may also be displayed in a GUI. Additionally or alternatively, the results of the open check may be stored in a file to be read by another software application (e.g., EDA verification software). One or more of the identified/detected floating connections may be corrected in the augmented reduced layout and/or the original layout (in 305).

In 340, the metal layers of one or more selected second tier cells may be added to the augmented reduced layout. These second tier cells may be selected by a user (e.g., LVS engineer). As discussed above, prior to 340, the cells in the second tier are represented as black boxes with pin information. During execution of 340, the black box representation of a selected second tier cell is replaced with the metal layers of the second tier cell and the pin information of the second tier cell is retained. If a selected second tier cell contains a cell (e.g., a third tier cell), a black box representation of the third tier cell along with pin information for the third tier cell may also be added to the augmented reduced layout. Then, one or more of the interconnectivity check, the text-based short check, the topological-based short check, and the open check may be executed again on the augmented reduced layout. Alternatively, one or more of the checks in 335 may be skipped and only performed in 340. These checks may identify connectivity mismatches, shorts, and/or floating connections inside the second tier cells in addition to connectivity mismatches, short, and/or floating connections associated with the top tier. One or more of the connectivity mismatches, shorts, and/or floating connections may be corrected in the augmented reduced layout and/or the original layout (in 305).

In 350, a conventional LVS check may be performed on the original layout after the corrections have been made to the original layout (e.g., corrections made in 320, 325, 335, 340). In general, shorts (especially if the short occurs over the power and ground nets), floating connections, and connectivity mismatches, especially associated with the top tier, are often responsible for the long runtimes of conventional LVS checks and the excessive consumption of computing resources by conventional LVS checks. Accordingly, by identifying/detecting and correcting (e.g., removing) these shorts, connections, and connectivity mismatches before running a convention LVS check, the conventional LVS check in 350 is likely to have a faster runtime and consume fewer computing resources.

In one or more embodiments, the steps of the process depicted in FIG. 3 may be grouped into three stages: stage 1, stage 2, and stage 3. Specially, steps 315, 320, and 325 may belong to stage 1, while steps 330, 335, and 340 may belong to stage 2. Step 350 may belong to stage 3. Any of stage 1, stage 2, and stage 3 (and thus any of the steps depicted in FIG. 3) may be executed at any design stage for the circuit including, but not limited to floorplan and place & route, full chip integration, an engineering change order (ECO), last-minute Macro updates, etc. There can be any number of stages per user's preference and design phase.

In one or more embodiments, besides merging all the design components and running the conventional LVS check, the LVS engineer's responsibilities may include to: (i) make sure the top tier design is LVS clean (and if not, to inform top level design owner); (ii) make sure the merging of the lower hierarchical layout components is done correctly; and (iii) check if any lower hierarchical design components are failing LVS or causing any top LVS failure at the top tier design (and if so, to inform the owner of the component of the issue).

In one or more embodiments, the LVS check running over the fullchip design for the preparation of foundry manufacturing requires the LVS runset that is provided by the foundry. Any LVS runset has a specific portion to define primitive device components. And the layers that are used for those definitions of primitive device component can be recognized as FEOL layers. One or more embodiments makes those FEOL layers empty throughout the process depicted in FIG. 3 so that the LVS can ignore any information that would be derived from the FEOL layers.

For the exceptional cases where certain FEOL layers cannot be emptied (e.g., filtered out), for example, some FEOL layers are used for pin information of design components or the top tier design, one or more embodiments provide a way for a user to specify a list of FEOL layers that cannot be emptied (e.g., filtered out). This list should be pre-processed before the process depicted in FIG. 3 is executed.

Figure 4A:
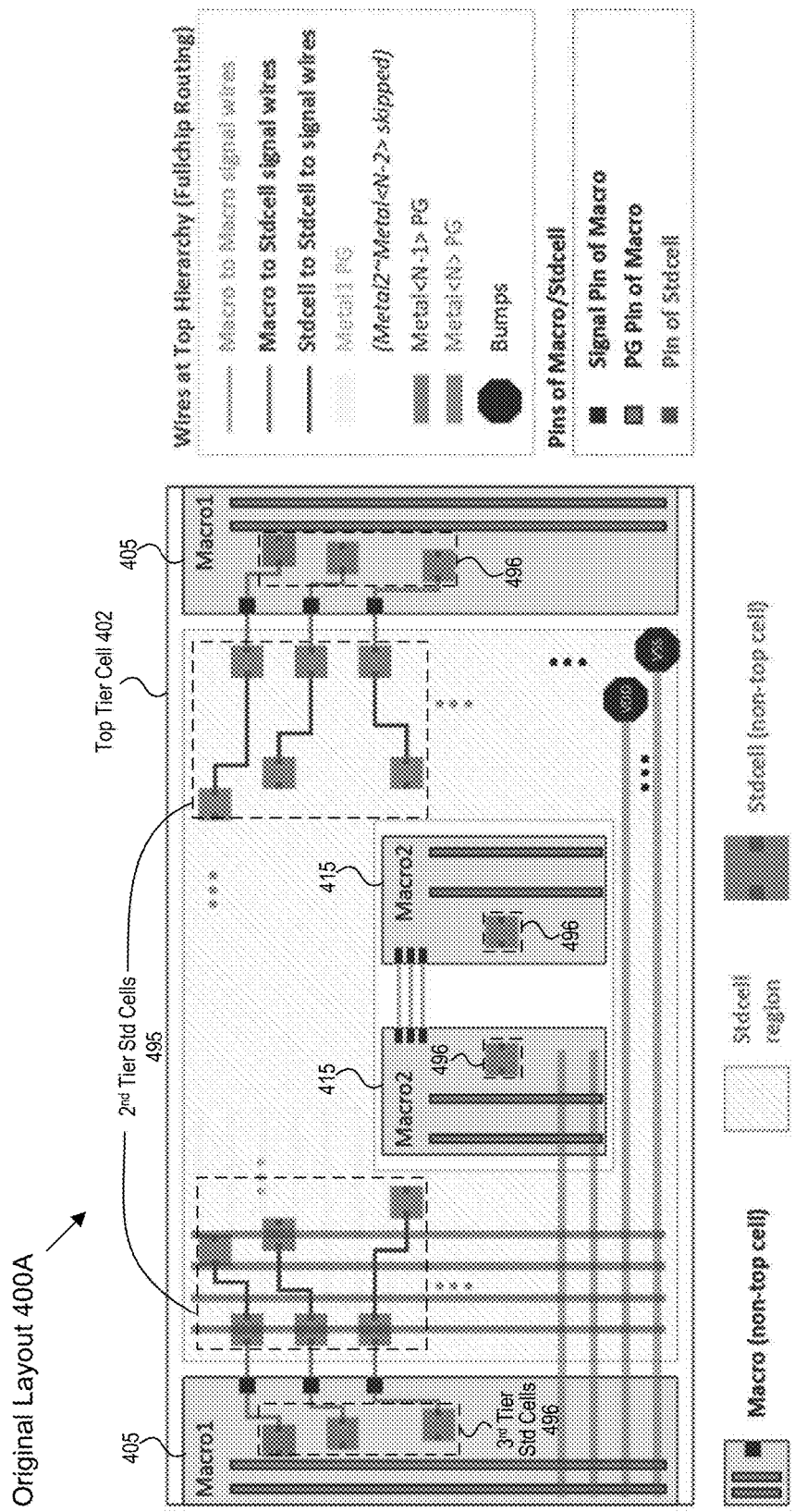
FIGS. 4A-4G depict one or more examples of verifying a circuit in accordance with one or more embodiments.

FIGS. 4A-4G show examples in accordance with one or more embodiments. Specifically, FIG. 4A show an original layout 400A of a circuit. Original layout 400A may correspond to the original layout in 305, discussed above in reference to FIG. 3. Original layout 400A is composed of cells arranged in a cell hierarchy. Original layout 400A has a top tier cell 402. The top tier cell 402 contains multiple instances of macro 1 405, multiple instances of macro 2 415, and multiple instances of standard cells 495. Accordingly, macro 1 405, macro 2 415, and the standard cells 495 are second tier cells. Macro 1 405 and macro 2 contain standard cells 496. Accordingly, standard cells 496 are third tier cells. Each of the cells may have metal layers.

Figure 4B:
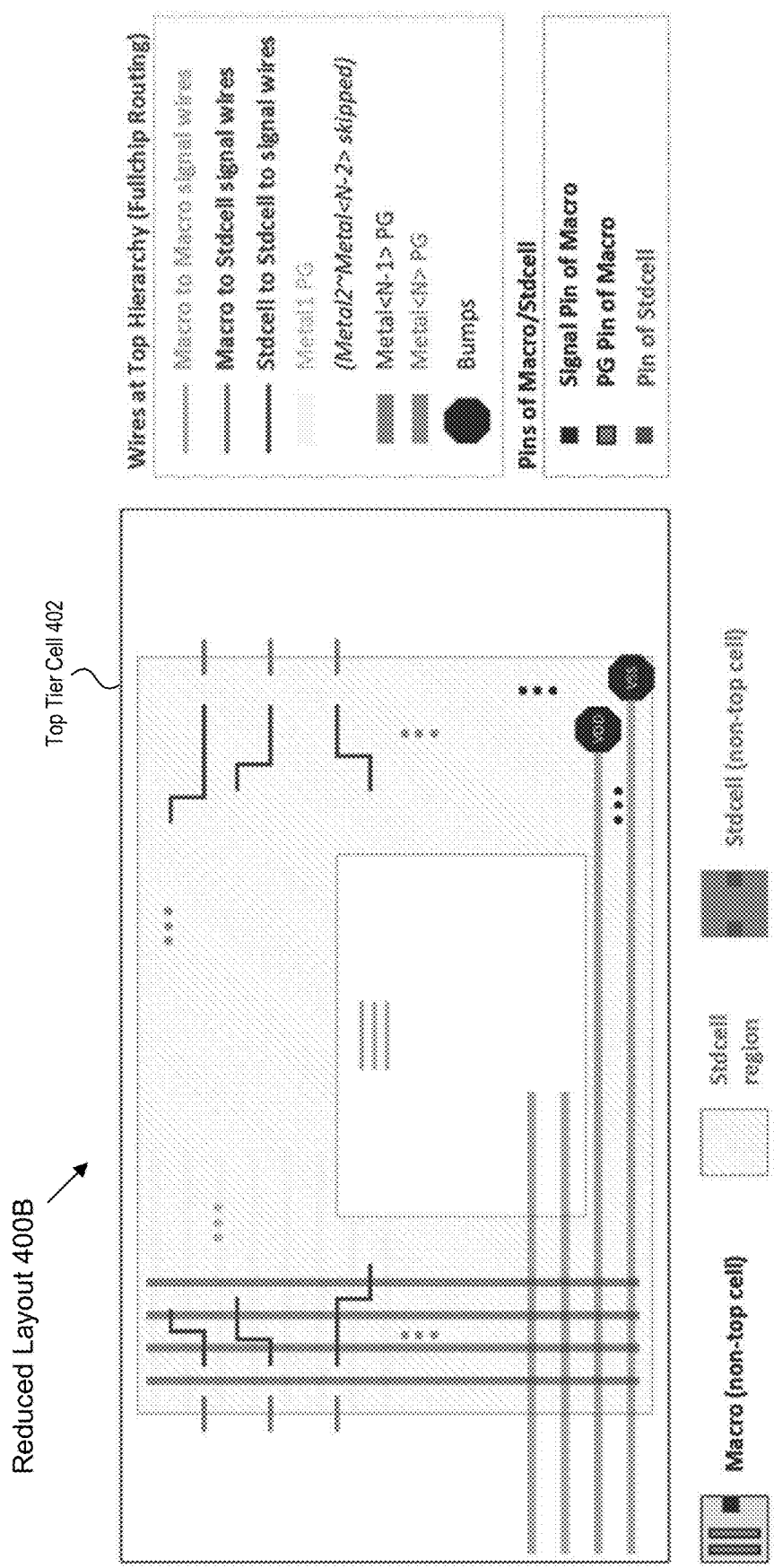

FIG. 4B shows a reduced layout 400B. Reduced layout 400B may correspond to the reduced layout in 315, discussed above in reference to FIG. 3. Reduced layout 400B may be generated by trimming the lower tiered cells (e.g., the cells outside of the top tier such as macro 1 405, macro 2 415, the second tier standard cells 495, and the third tier standard cells 496) and then filtering out the FEOL layers of the remaining cells (e.g., top tier cell 402). Accordingly, the reduced layout 400B includes mainly the metal layers of the top tier cells (e.g., top tier cell 402).

Figure 4C:
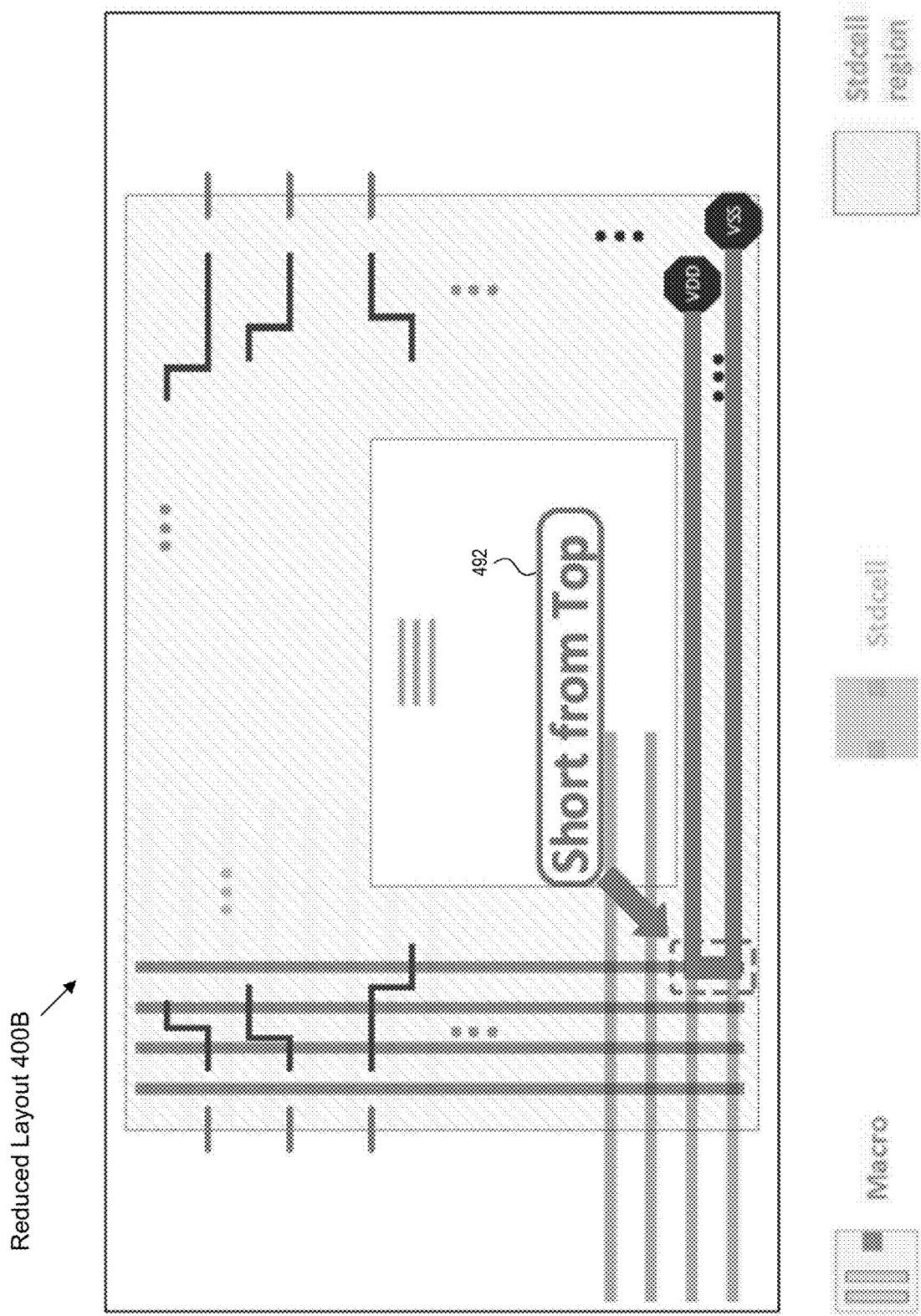

In FIG. 4C, a text-based short check is executed on the reduced layout 400B. This may correspond to step 320, discussed above in reference to FIG. 3. While executing the text-based short check, a short 492 is identified in reduced layout 400B. In one or more embodiments, the runtime of the text-based short check will be much quicker than conventional LVS and require fewer computing resources than conventional LVS since the reduced layout 400B has mainly metal layers of the cells in the top tier of the cell hierarchy (e.g., the cells in the lower tiers were trimmed away and the FEOL layers were filtered out). Short 492 may be corrected in both reduced layout 400B and the original layout 400A.

Figure 4D:
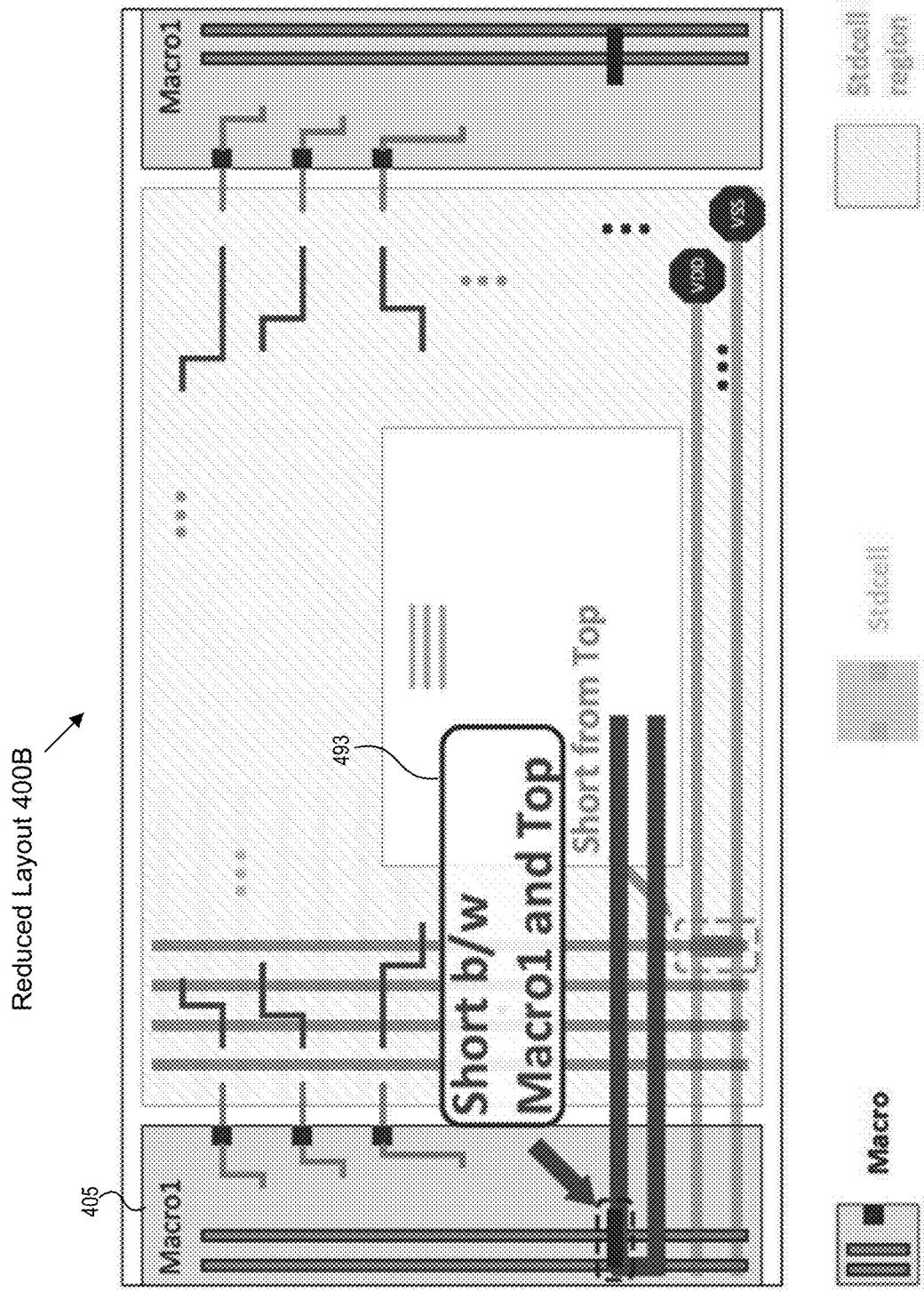

In FIG. 4D, the metal layers of macro 1 405 are added to the reduced layout 400B and the text-based short check is executed again. FIG. 4D may correspond to step 325, discussed above in reference to FIG. 3. The metal layers of macro 1 405 may have been added in response to an explicit request from the user (e.g., LVS engineer). For example, the user may believe that macro 1 405 is somehow involved in the detected short 492 in FIG. 4C. Alternatively, the user may just want to check for shorts in macro 1 405. While executing the text-based short check, a short 493 is identified between macro 1 405 and the top tier cell 402. Short 493 may be corrected in both reduced layout 400B and the original layout 400A.

Figure 4E:
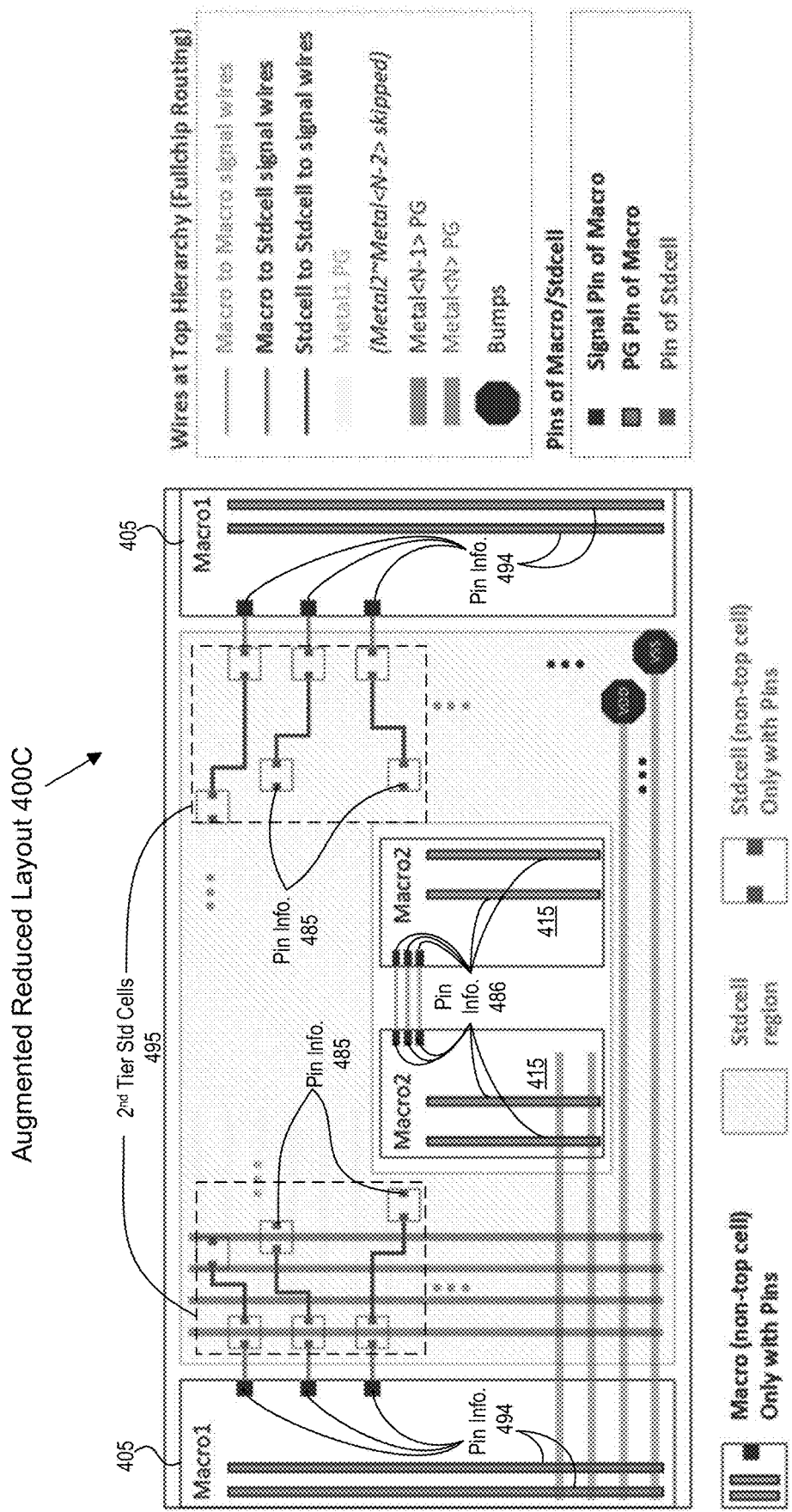

In FIG. 4E, an augmented reduced layout 400C is generated. This may correspond to step 330 discussed above in reference to FIG. 3. The augmented reduced layout 400C is similar to the reduced layout 400B in that the FOEL layers have been filtered out. However, the augmented reduced layout 400C, unlike the reduced layout 400B, includes black box representations of the second tier cells (e.g., macro 1 405, macro 2 415, standard cells 495) and the pin information (485, 494, 486) for each of those second tier cells. As discussed above, these second tier cells are directly connected to one or more of the cells in the top tier (e.g., top tier cell 402). The pin information may have been extracted from the original layout 400A. The augmented reduced layout 400C may be generated solely from the original layout 400A. Alternatively, the augmented reduced layout 400C may be generated by starting with the reduce layout 400B and then adding the black boxes with pin information.

Figure 4F:
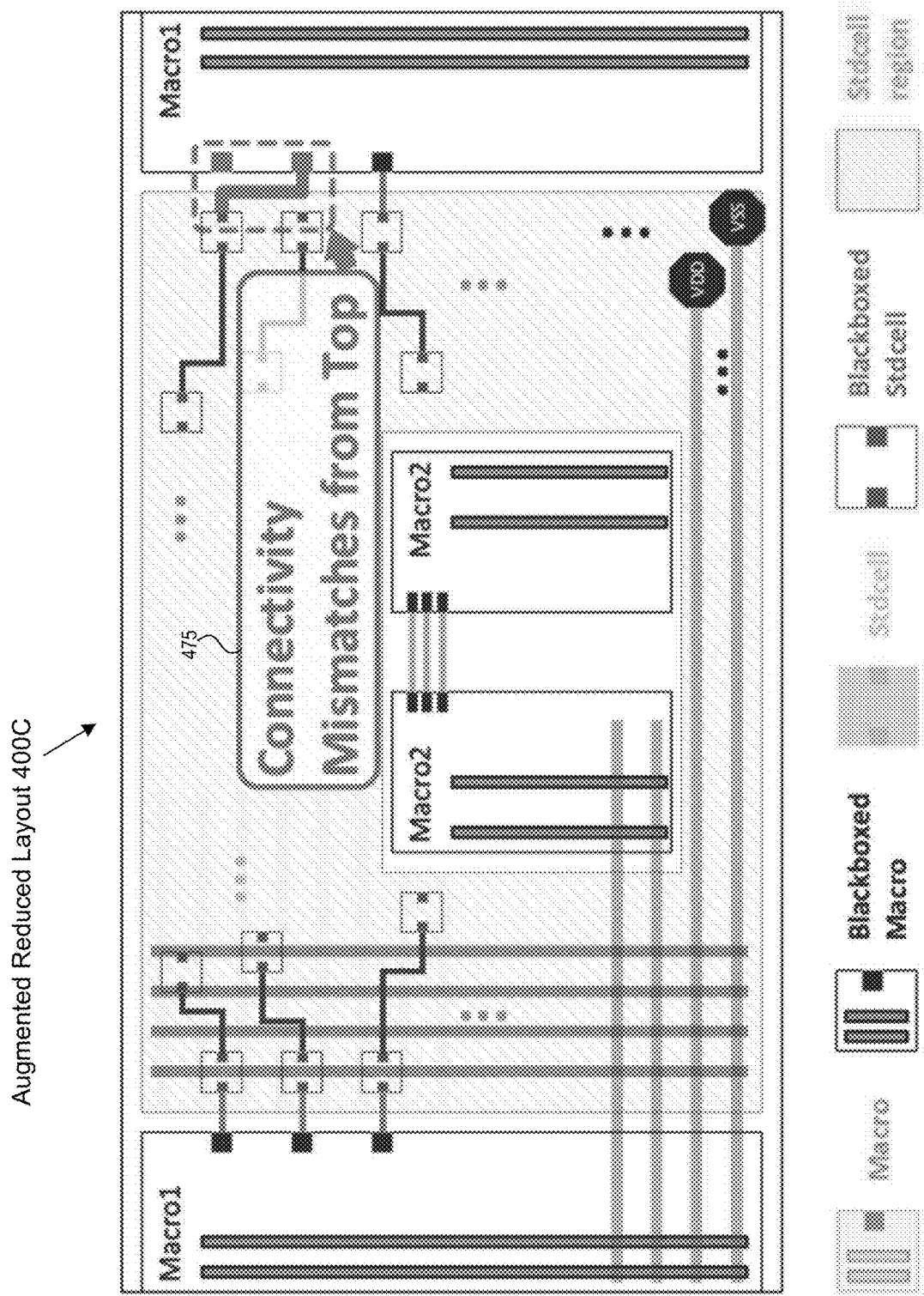

In FIG. 4F, an interconnectivity check is executed against the augmented reduced layout 400C. FIG. 4F may correspond to step 335, discussed above in reference to FIG. 3. While executing interconnectivity check, a connectivity mismatch 475 is identified. The connectivity mismatch 475 may be corrected in both augmented reduced layout 400C and the original layout 400A. Other checks including text-based short checks, topological-based short checks, open checks, etc. may also be executed against the augmented reduced layout 400C.

Figure 4G:
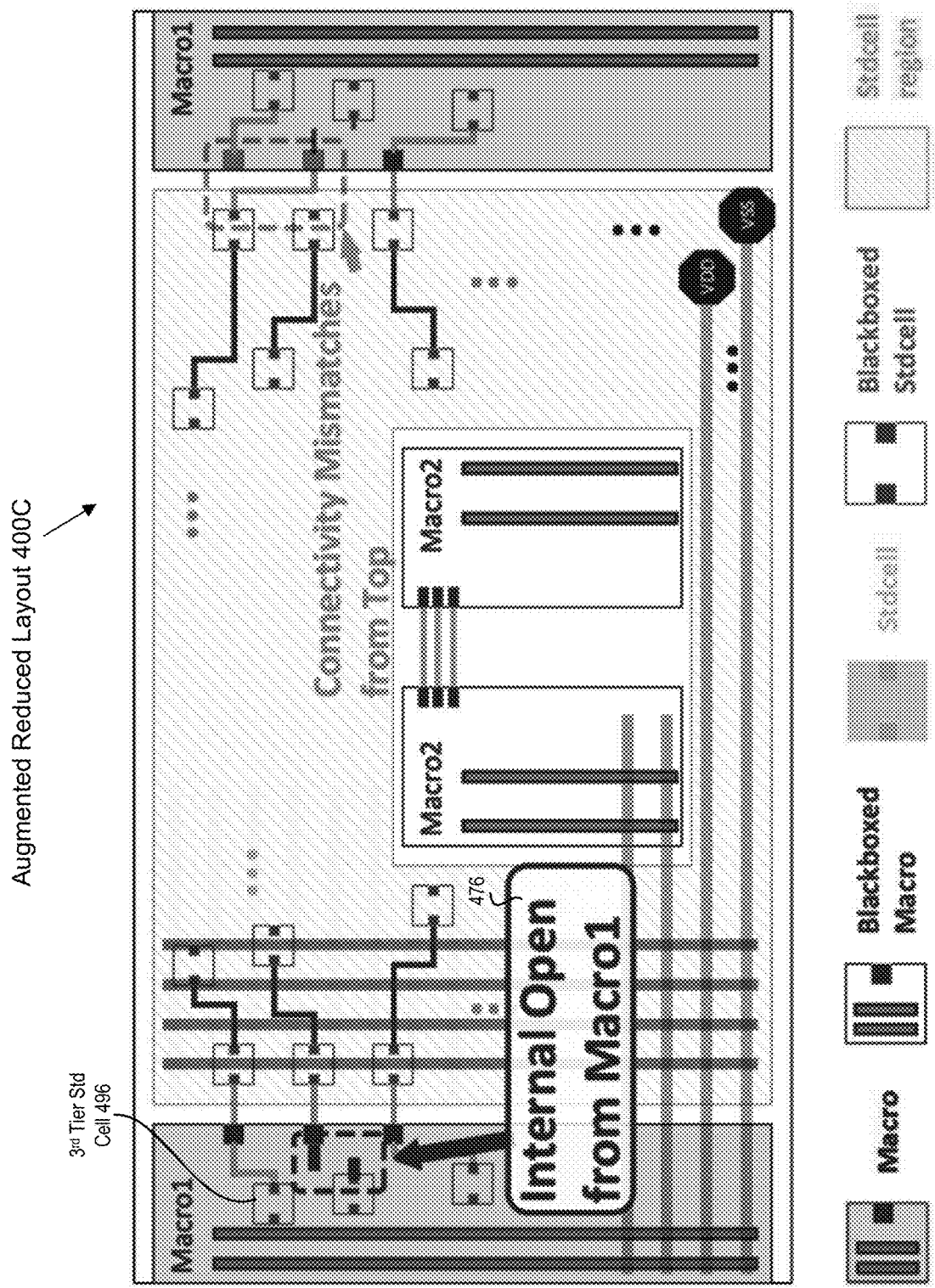

In FIG. 4G, the metal layers of macro 1 405 are added to the augmented reduced layout 400C. FIG. 4G corresponds to step 340, discussed above in reference to FIG. 3. Moreover, the standard cells 496 contained within macro 1 405 (e.g., third tier cells) may be represented as black boxes with pin information for the standard cells 496. The metal layers of macro 1 405 may have been added in response to an explicit request from the user (e.g., LVS engineer). While executing an open check, an open (e.g., floating connection) 476 is identified within macro 1 405. The open 476 may be corrected in both augmented reduced layout 400C and the original layout 400A. Other checks including text-based short checks, topological-based short checks, open checks, etc. may also be executed against the augmented reduced layout 400C.

Following FIG. 4G, a conventional LVS check may be executed on the original layout 400A. This may correspond to step 350, discussed above in reference to FIG. 3. As short 492, short 493, connectivity mismatch 475, and open 476 have already been identified and corrected, the runtime of the conventional LVS check will be reduced and fewer computing resources will be needed to perform the conventional LVS check.

Figure 5:
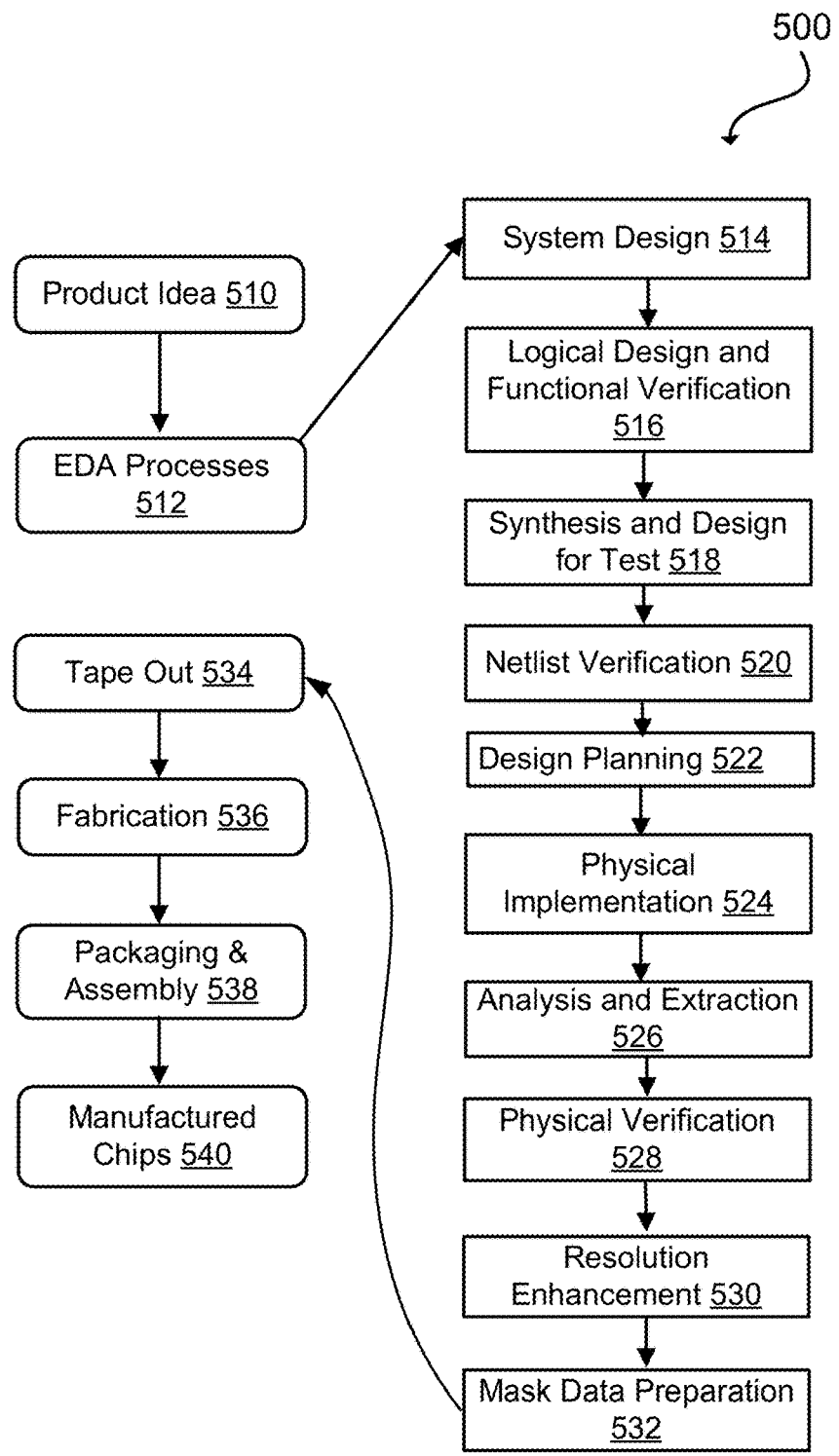
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. The process depicted in FIG. 3 may be used in the verification of the circuit layout. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 6:
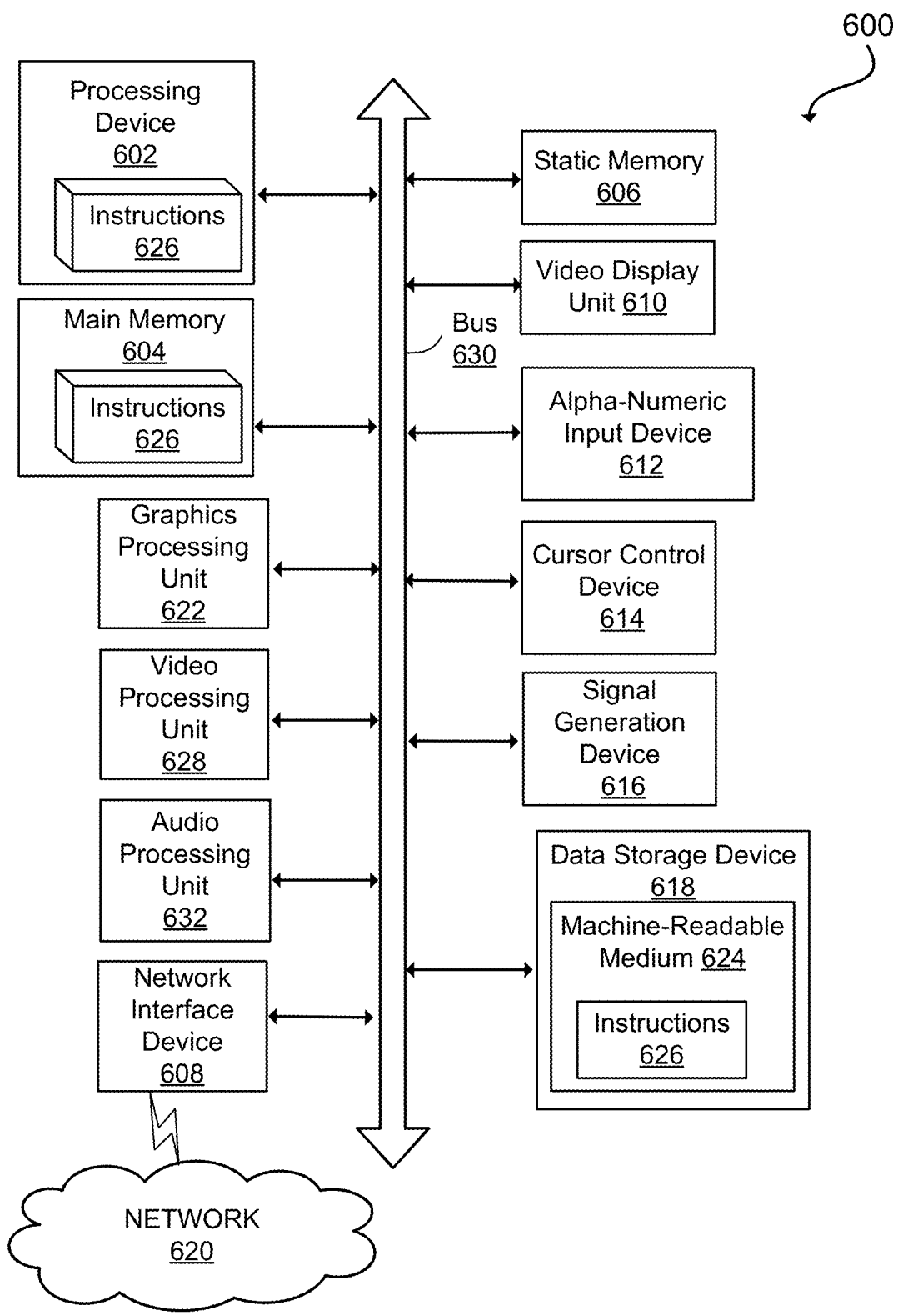
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   obtaining an original layout for a circuit comprising a plurality of cells arranged in a cell hierarchy, a plurality of front-end-of-line (FEOL) layers, and a plurality of back-end-of-line (BEOL) layers;
   generating a reduced layout for the circuit by trimming a first subset of the plurality of cells below a top tier of the cell hierarchy and filtering out the plurality of FEOL layers;
   executing a text-based short check on the reduced layout for the circuit;
   generating, by at least one processor, an augmented reduced layout for the circuit comprising pin information extracted from the original layout for a second subset of the plurality of cells, wherein the second subset of the plurality of cells are connected to the top tier;
   executing an interconnectivity check on the augmented reduced layout based on a schematic for the circuit; and
   outputting a result based on at least one of the text-based short check and the interconnectivity check, wherein the result comprises a location of a short or a location of a connectivity mismatch.

2. The method of claim 1, further comprising:
   removing the short identified during the text-based short check; and
   executing a layout versus schematic check after removing the short.

3. The method of claim 1, further comprising:
receiving a request to include only a subset of the plurality of BEOL layers in the reduced layout,
wherein generating the reduced layout includes filtering out at least one BEOL layer not in the subset of the plurality of BEOL layers.

4. The method of claim 1, further comprising:
adding a plurality of metal layers for a cell in the second subset to the reduced layout before executing the text-based short check.

5. The method of claim 1, further comprising:
executing a text-based short check, a topological-based short check, and an open check on the augmented reduced layout for the circuit.

6. The method of claim 1, further comprising:
removing the connectivity mismatch identified during the interconnectivity check; and
executing a layout versus schematic check after removing the connectivity mismatch.

7. The method of claim 1, further comprising:
adding a plurality of metal layers for a cell in the second subset to the augmented reduced layout before executing the interconnectivity check.

8. A non-transitory computer readable medium (CRM) comprising stored instructions, which when executed by a processor, cause the processor to:
obtain an original layout for a circuit comprising a plurality of cells arranged in a cell hierarchy, a plurality of front-end-of-line (FEOL) layers, and a plurality of back-end-of-line (BEOL) layers;
generate a reduced layout for the circuit by trimming a first subset of the plurality of cells below a top tier of the cell hierarchy and filtering out the plurality of FEOL layers;
execute a text-based short check on the reduced layout for the circuit;
generate an augmented reduced layout for the circuit comprising pin information extracted from the original layout for a second subset of the plurality of cells, wherein the second subset of the plurality of cells are connected to the top tier;
execute an interconnectivity check on the augmented reduced layout based on a schematic for the circuit; and
output a result based on at least one of the text-based short check and the interconnectivity check.

9. The non-transitory CRM of claim 8, wherein the instructions further cause the processor to:
remove a short identified during the text-based short check, wherein the result comprises a location of the short; and
execute a layout versus schematic check after removing the short.

10. The non-transitory CRM of claim 8, wherein the instructions further cause the processor to:
add a plurality of metal layers for a cell in the second subset to the reduced layout before executing the text-based short check.

11. The non-transitory CRM of claim 8, wherein the instructions further cause the processor to:
receive a request to include only a subset of the plurality of BEOL layers in the reduced layout,
wherein generating the reduced layout includes filtering out at least one BEOL layer not in the subset of the plurality of BEOL layers.

12. The non-transitory CRM of claim 8, wherein instructions further cause the processor to:
execute a text-based short check, a topological-based short check, and an open check on the augmented reduced layout for the circuit.

13. The non-transitory CRM of claim 8, wherein the instructions further cause the processor to:
remove a connectivity mismatch identified during the interconnectivity check, wherein the result comprises a location of a connectivity mismatch; and
execute a layout versus schematic check after removing the connectivity mismatch.

14. The non-transitory CRM of claim 8, wherein the instructions further cause the processor to:
add a plurality of metal layers for a cell in the second subset to the augmented reduced layout before executing the interconnectivity check.

15. A system, comprising:
a memory storing instructions; and
a processor, coupled with the memory and to execute the instructions, the instructions when executed cause the processor to:
obtain an original layout for a circuit comprising a plurality of cells arranged in a cell hierarchy, a plurality of front-end-of-line (FEOL) layers, and a plurality of back-end-of-line (BEOL) layers;
generate a reduced layout for the circuit by trimming a first subset of the plurality of cells below a top tier of the cell hierarchy and filtering out the plurality of FEOL layers;
execute a text-based short check on the reduced layout for the circuit;
generate an augmented reduced layout for the circuit comprising pin information extracted from the original layout for a second subset of the plurality of cells, wherein the second subset of the plurality of cells are connected to the top tier;
execute an interconnectivity check on the augmented reduced layout based on a schematic for the circuit; and
output a result based on at least one of the text-based short check and the interconnectivity check.

16. The system of claim 15, wherein the instructions further cause the processor to:
remove a short identified during the text-based short check, wherein the result comprises a location of the short; and
execute a layout versus schematic check after removing the short.

17. The system of claim 15, wherein the instructions further cause the processor to:
add a plurality of metal layers for a cell in the second subset to the reduced layout before executing the text-based short check.

18. The system of claim 15, wherein the instructions further cause the processor to:
execute a text-based short check, a topological-based short check, and an open check on the augmented reduced layout for the circuit.

19. The system of claim 15, wherein the instructions further cause the processor to:
remove a connectivity mismatch identified during the interconnectivity check, wherein the result comprises a location of a connectivity mismatch; and
execute a layout versus schematic check after removing the connectivity mismatch.

20. The system of claim 15, wherein the instructions further cause the processor to:

add a plurality of metal layers for a cell in the second subset to the augmented reduced layout before executing the interconnectivity check.

* * * * *